(12) United States Patent
Chen et al.

(10) Patent No.: US 7,135,730 B2
(45) Date of Patent: Nov. 14, 2006

(54) BIAS-INDEPENDENT CAPACITOR BASED ON SUPERPOSITION OF NONLINEAR CAPACITORS FOR ANALOG/RF CIRCUIT APPLICATIONS

(75) Inventors: Chun-ying Chen, Irvine, CA (US); Jungwoo Song, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/759,076

(22) Filed: Jan. 20, 2004

(65) Prior Publication Data
US 2005/0156219 A1    Jul. 21, 2005

(51) Int. Cl.
*H01L 27/108* (2006.01)
*H01L 29/76* (2006.01)
*H01L 29/94* (2006.01)
*H01L 29/00* (2006.01)
*G11C 5/14* (2006.01)

(52) U.S. Cl. ............... 257/300; 257/288; 257/296; 257/532; 327/530

(58) Field of Classification Search ........... 257/300, 257/296, 288, 532; 327/530
See application file for complete search history.

(56) References Cited

U.S. PATENT DOCUMENTS 5,254,880 A * 10/1993 Horiguchi et al. .......... 327/530

* cited by examiner

*Primary Examiner*—Steven Loke
(74) *Attorney, Agent, or Firm*—Sterne, Kessler, Goldstein & Fox, P.L.L.C.

(57) ABSTRACT

A first MOS-on-NWELL device is formed on a substrate and has its pickup terminals optionally connected together. A second MOS-on-NWELL device is formed on the substrate and has its pickup terminals optionally connected together. A gate of the first MOS-on-NWELL device is connected to the pickup terminals of the second MOS-on-NWELL device. A gate of the second MOS-on-NWELL device is connected to the pickup terminals of the first MOS-on-NWELL device. A first PMOS transistor is formed on a substrate and has its source and drain terminals connected together. A second PMOS transistor is formed on a substrate and has its source and drain terminals connected together. A gate of the first PMOS transistor is connected to the source and drain terminals of the second PMOS transistor. A gate of the second PMOS transistor is connected to the source and drain terminals of the first PMOS transistor. A combination of the first and second PMOS transistors are connected in parallel with the first and second MOS-on-NWELL devices.

1 Claim, 6 Drawing Sheets

BIAS-INDEPENDENT CAPACITOR BASED ON SUPERPOSITION OF NONLINEAR CAPACITORS FOR ANALOG/RF CIRCUIT APPLICATIONS

BACKGROUND OF THE INVENTION

1. Field of the Invention

The present invention is related to capacitors used in integrated circuits, and more particularly, to linear capacitors for use in analog and RF circuits.

2. Related Art

In analog/RF integrated circuits, bias-voltage-independent capacitors are needed to achieve high linearity of circuit performance. However, the bias-voltage-independent capacitors, such as fringe capacitors (made by sidewalling of metal lines), MIM (metal-insulator-metal) capacitors, or poly-oxide-poly capacitors are fairly expensive. These types of capacitors require a large surface area or additional processing steps, leading to higher manufacturing costs. On the other hand, MOSFET-type capacitors have the highest capacitance per unit area, since they are formed by thin gate-oxide, but their capacitance value is dependent on the gate/pickup terminals voltage, and is often non-linear.

Traditionally, circuit designers have chosen Metal-insulator-Metal (MIM) or Poly-insulator-Poly (PIP) based capacitors for bias-independent linear capacitors. However these types of capacitor require a larger area and sometimes require additional fabrication processing steps leading to higher manufacturing costs.

SUMMARY OF THE INVENTION

The present invention is directed to a bias-independent capacitor based on superposition of nonlinear capacitors for analog/RF circuit applications that substantially obviates one or more of the problems and disadvantages of the related art.

An embodiment of the present invention includes a first MOS-on-NWELL device formed on a substrate with its pickup terminals optionally connected together. A second MOS-on-NWELL device is formed on the substrate with its pickup terminals optionally connected together. A gate of the first MOS-on-NWELL device is connected to the pickup terminals of the second MOS-on-NWELL device. A gate of the second MOS-on-NWELL device is connected to the pickup terminals of the first MOS-on-NWELL device. A first PMOS transistor is formed on the substrate with its source and drain terminals connected together. A second PMOS transistor is formed on a substrate with its source and drain terminals connected together. A gate of the first PMOS transistor is connected to the source and drain terminals of the second PMOS transistor. A gate of the second PMOS transistor is connected to the source and drain terminals of the first PMOS transistor. A combination of the first and second PMOS transistors are connected in parallel with the first and second MOS-on-NWELL devices.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

In this invention, a new method is proposed, based on MOSFET devices, of achieving a high density of capacitance with low-bias dependence and high linearity. For parallel-connected bias-dependent capacitors (such as MOSFET devices) with bias voltage Vg, the total capacitance is $Ct(Vg)=\Sigma\ Ci(Vg)$, where each Ci is a function of bias voltage that is applied to both ends. In CMOS technology, for example, a capacitor can be made with NMOS devices, PMOS devices, native-NMOS devices, MOS on NWELL devices, MOS on PWELL devices, or any other capacitor available in that process.

To achieve a higher density of capacitors in an integrated circuit (IC) chip, MOS devices whose capacitance is based on a thin gate oxide, are the best choice. However, the MOS capacitors are highly bias-voltage dependent, which is not desirable in most applications. In this invention, different types and polarities of MOS devices are used to achieve less bias-dependent capacitors.

Figure 1A:
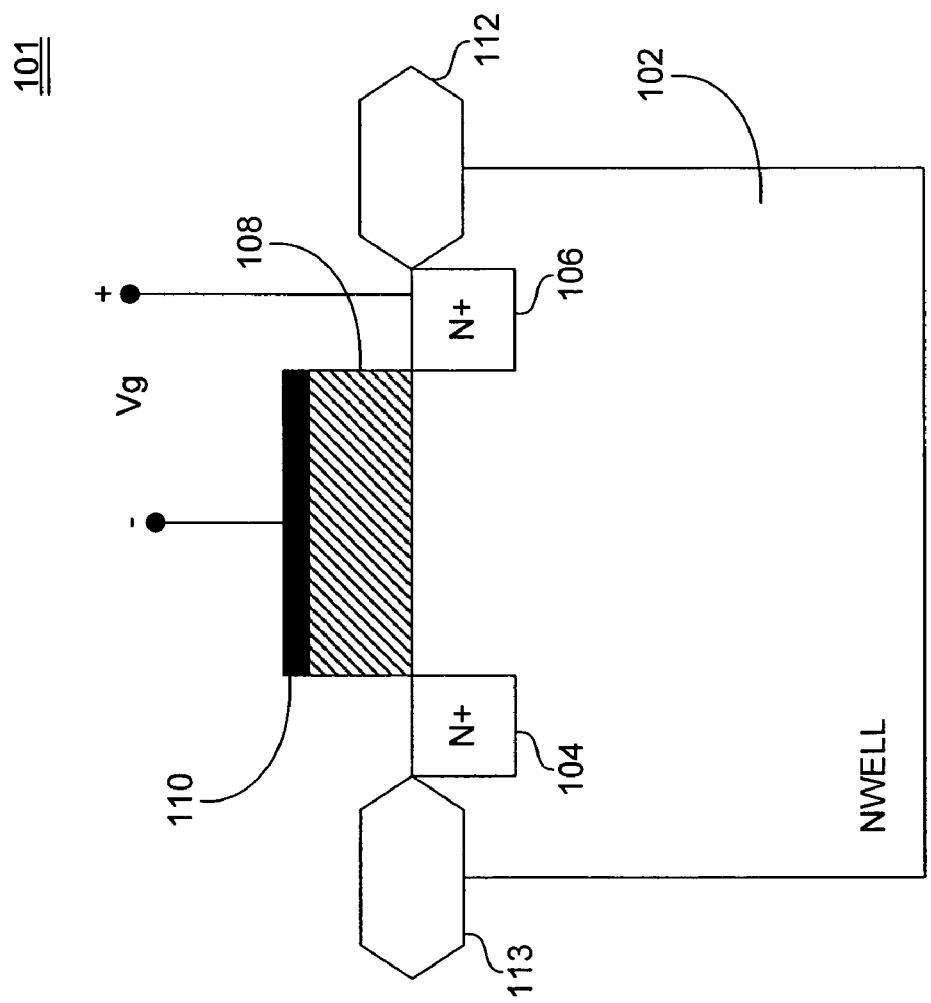
FIG. 1A illustrates a MOS-on-NWELL device that may be used as a capacitor.

FIG. 1A illustrates a typical MOS-on-NWELL device 101 that may be used as a capacitor. As shown in FIG. 1A, a substrate 102 includes the NWELL. Pickup contacts (pickup terminals) 104, 106 are N+ doped, and are isolated from adjacent MOS devices using isolation regions 112, 113. A gate oxide layer 108 is placed above a channel region of the device (not designated in FIG. 1A). A gate electrode 110 has a voltage Vg applied to it.

Figure 1C:
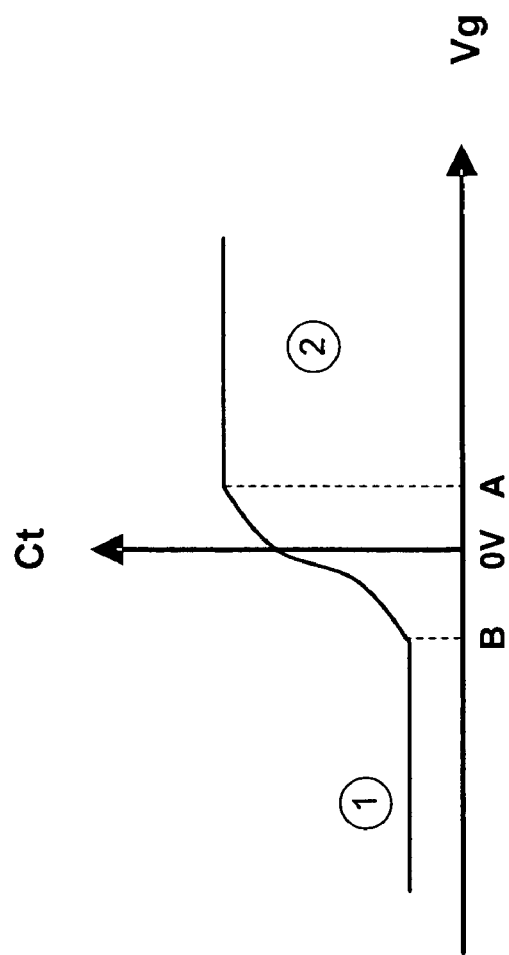
FIG. 1C illustrates a capacitance of the MOS-on-NWELL device of FIG. 1B as a function of applied voltage.
Figure 1B:
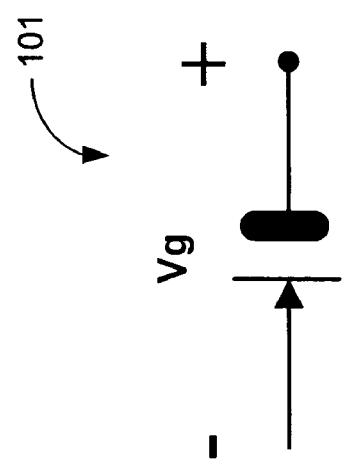
FIG. 1B illustrates a single MOS-on-NWELL device connected to function as a capacitor.

FIG. 1B illustrates the single MOS-on-NWELL device 101 connected to function as a capacitor. In FIG. 1B, the pickup terminals 104, 106 of FIG. 1A are tied together. FIG. 1C illustrates a capacitance of the device 101 of FIG. 1B as a function of applied voltage Vg. The curve of FIG. 1C may be divided into three regions. A depletion region 1 is to the left of point B. An accumulation region 2 is to the right of point A. A region between A and B is a non-linear region, where the capacitance of the device depends non-linearly on the applied voltage Vg. Typically the capacitance in region 1 is roughly one third of the capacitance of region 2, although this parameter is highly process dependent. With the graph of FIG. 1C in mind, it is clear why the use of a single MOS-on-NWELL capacitor 101 is problematic in RF and analog circuits that require linearity. More specifically, the region between A and B is problematic for RF operation.

Figure 2B:
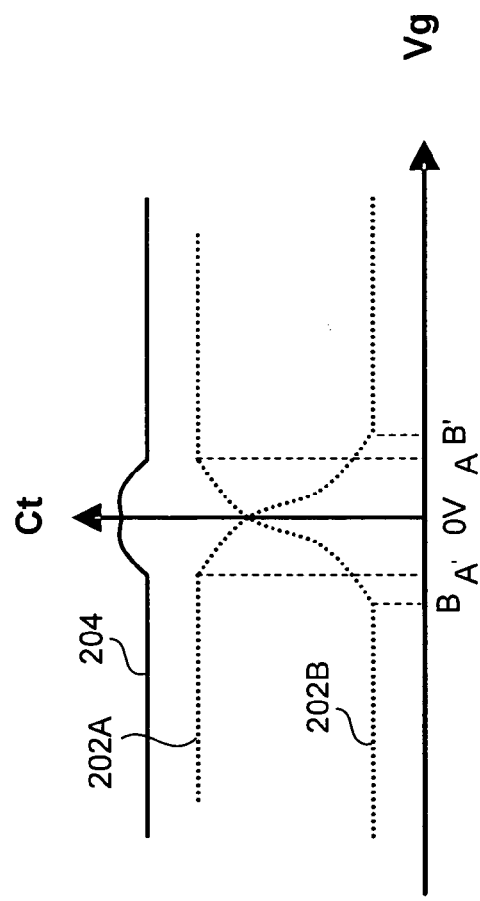
FIG. 2B shows a total capacitance of the combination of the two devices of FIG. 2A.
Figure 2A:
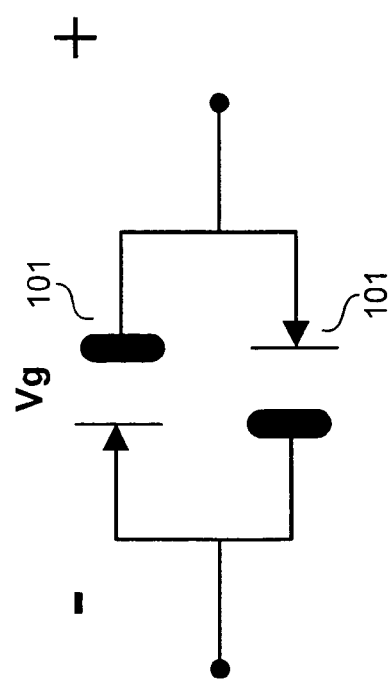
FIG. 2A illustrates how two MOS-on-NWELL devices may be connected to act as a single capacitor with a substantially linear total capacitance as a function of the applied voltage.

FIG. 2A illustrates how two MOS-on-NWELL devices 101 may be connected to act as a single capacitor with a substantially linear total capacitance as a function of the applied voltage Vg. As shown in FIG. 2A, one MOS-on-NWELL device 101 is connected with the polarity as shown in FIG. 1B, and a second device 101 is connected with a reverse polarity (compared to the first device). The total capacitance of the combination of the two devices 101 (one of which is operating in a depletion region, and one in an accumulation region) is shown by the solid line 204 in FIG. 2B.

The dashed lines 202A, 202B in FIG. 2B represent the individual C(Vg) curves of the two MOS-on-NWELL devices 101. With the devices 101 connected as shown in FIG. 2A, each point A has a mirror point A', and each point B has a mirror point B' relative to zero voltage. With the dashed curves adding up to the solid curve 204, the capacitance as a function of voltage of the circuit of FIG. 2A is substantially flat throughout the voltage of interest, except for a small "bump" near zero voltage.

Thus, FIG. 1A shows an example for MOS-on-NWELL devices. FIG. 1C shows a C-V curve for the single MOS-on-NWELL device 101 of FIG. 1A. The threshold voltage of MOS-on-NWELL devices is slightly negative. Thus if two such curves are superimposed together, but one with reverse polarity, the C-V curves of FIG. 2B results. The C-V curve is symmetrical to Vg=0 and is much less sensitive to Vg. Due to the negative threshold voltage, the C-V curve shows slightly "bump" around Vg=0.

Figure 3B:
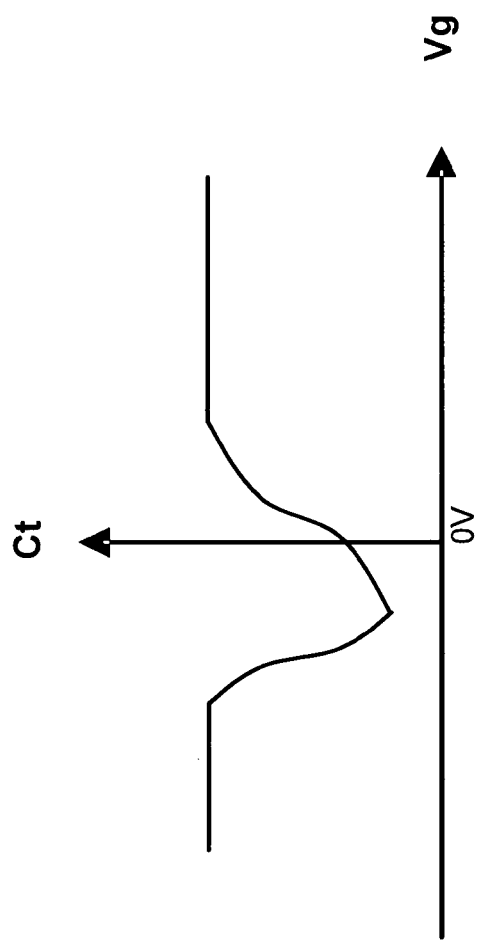
FIG. 3B shows a capacitance as a function of the applied voltage for the device of FIG. 3A.
Figure 3A:
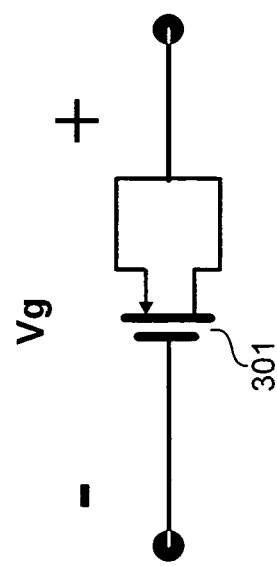
FIG. 3A shows a PMOS transistor connected to act as a MOS capacitor.

FIG. 3A shows a PMOS transistor 301 connected to act as a MOS capacitor, with its source and drain terminals tied together and to a positive voltage, and its gate tied to a negative voltage. FIG. 3B shows a capacitance as a function of the applied voltage for the device 301 of FIG. 3A.

Figure 4B:
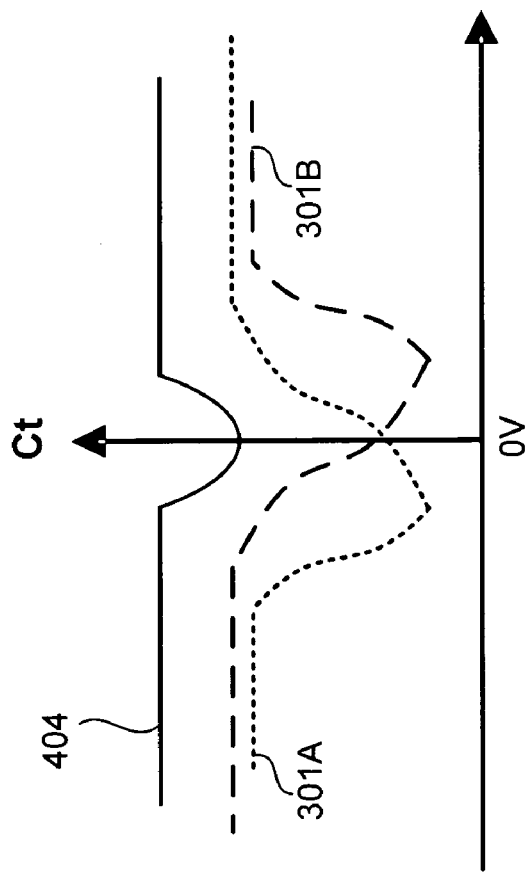
FIG. 4B shows a total capacitance of the two PMOS transistors connected as in FIG. 4A.
Figure 4A:
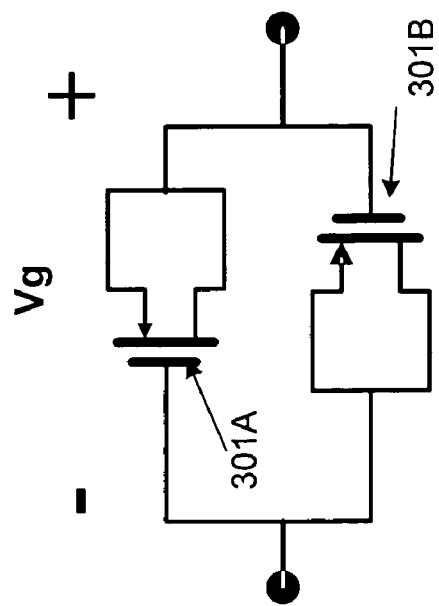
FIG. 4A illustrates two PMOS transistors connected in parallel to achieve a relatively flat capacitance as a function of voltage.

FIG. 4A illustrates how two PMOS transistors 301A, 301B may be connected in parallel to achieve a relatively flat capacitance as a function of voltage Vg, which is illustrated by the solid line of FIG. 4B. The dashed lines of FIG. 4B are the individual C(Vg) of the two devices 301A, 301B of FIG. 4A. Note that in this case, with the use of two PMOS transistors 301A 301B, the C-V curve 404 is relatively flat, with a slight drop around zero volts. Thus, FIG. 3B shows the C-V curve for a single PMOS device, and FIG. 4B shows the C-V curves for two parallel-connected PMOS devices with opposite polarity. The C-V curve is symmetrical to Vg=0 and has dip around Vg=0.

Figure 5B:
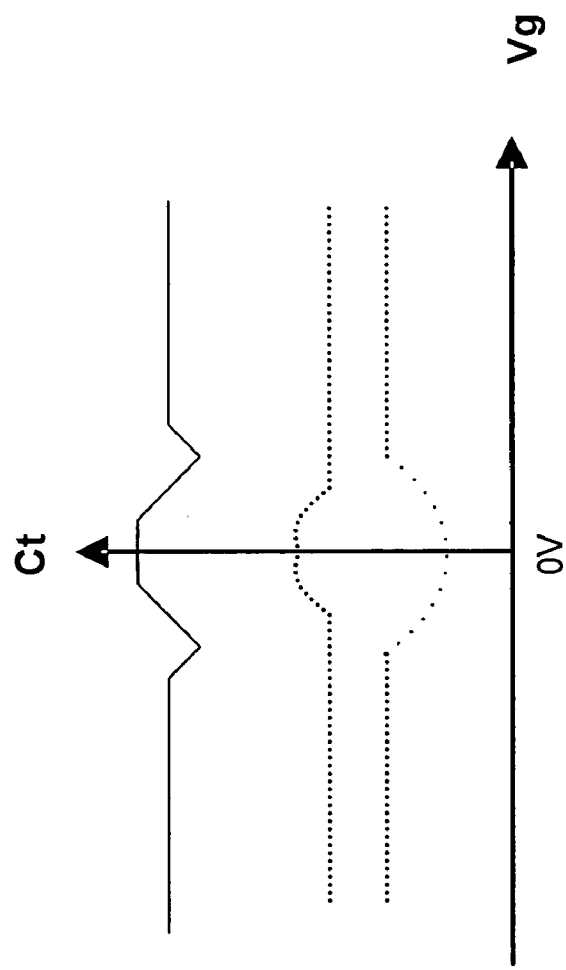
FIG. 5B shows a capacitance as a function of voltage for the circuit of FIG. 5A.
Figure 5A:
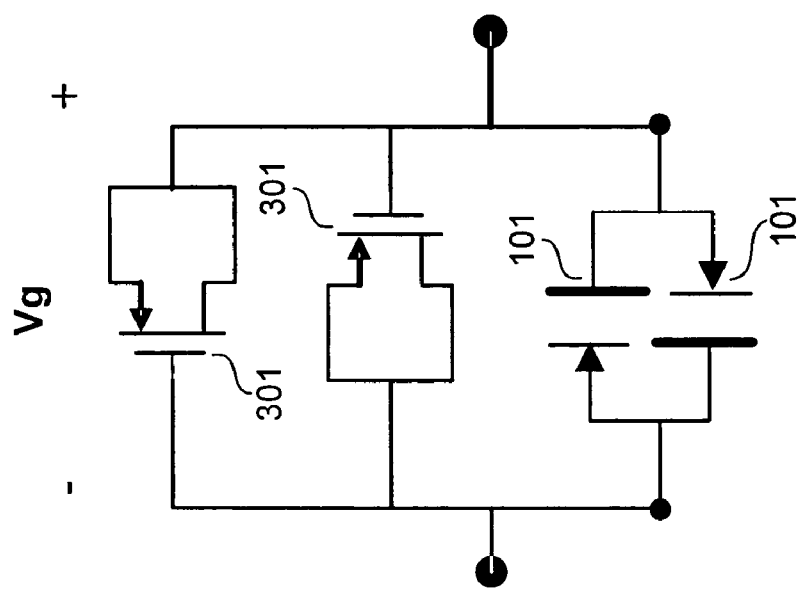
FIG. 5A illustrates four devices connected in parallel to achieve a substantially flat capacitance as a function of voltage.

FIG. 5A illustrates how four devices, i.e., two MOS-on-NWELL devices 101 and two PMOS transistors 301 can be connected in parallel to result in a substantially flat capacitance as a function of voltage. The capacitance as a function of voltage is shown as a solid line in FIG. 5B, with the dashed lines representing the individual contributions from the PMOS pair and the MOS-on-NWELL pair. In this case, the non-linearity around zero volts is even smaller (not shown to scale in this figure), since the non-linearities of the two pairs are used to substantially cancel each other out. In other words, FIG. 5A shows an example for the capacitance-combination of PMOS and MOS-on-NWELL devices. With optimum sizing of each device, the "dip" and "bump" can be used essentially to cancel each other, to get the flatter C-V curve of FIG. 5B.

With the present invention, the bias-independent capacitors can be implemented in MOS devices, which give much larger capacitance value for the same area without additional fabrication process.

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A capacitor for an integrated circuit comprising:
   a first MOS-on-NWELL (Metal Oxide Semiconductor-on-N-doped well) device formed on a substrate and having a first pickup terminal and a first gate;
   a second MOS-on-NWELL device formed on the substrate and having a second pickup terminal and a second gate,
   wherein the first gate is connected to the second pickup terminal, and
   wherein the second gate is connected to the first pickup terminal;
   a first PMOS (P-channel Metal Oxide Semiconductor) transistor formed on the substrate and having its source and drain terminals connected together; and
   a second PMOS transistor formed on the substrate and having its source and drain terminals connected together,
   wherein a gate of the first PMOS transistor is connected to the source and drain terminals of the second PMOS transistor,
   wherein a gate of the second PMOS transistor is connected to the source and drain terminals of the first PMOS transistor,
   wherein the first gate, the second pickup terminal, the gate of the first PMOS transistor and the source and drain terminals of the second PMOS transistor are connected to a first common terminal, and
   wherein the second gate, the first pickup terminal, the gate of the second PMOS transistor and the source and drain terminals of the first PMOS transistor are connected to a second common terminal.

* * * * *